United States Patent
Kim

(10) Patent No.: US 12,406,714 B2
(45) Date of Patent: Sep. 2, 2025

(54) SEMICONDUCTOR MEMORY DEVICE PERFORMING TARGET REFRESH AND MEMORY SYSTEM INCLUDING THE SAME

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 472 days.

(21) Appl. No.: 17/748,471

(22) Filed: May 19, 2022

(65) Prior Publication Data
US 2023/0215483 A1 Jul. 6, 2023

(30) Foreign Application Priority Data
Jan. 3, 2022 (KR) .................... 10-2022-0000227

(51) Int. Cl.
  *G11C 11/406* (2006.01)
(52) U.S. Cl.
  CPC .................. *G11C 11/406* (2013.01)
(58) Field of Classification Search
  CPC .................................... G11C 11/406
  USPC ......................................... 365/222
  See application file for complete search history.

(56) References Cited

U.S. PATENT DOCUMENTS

| | | | | |
|---|---|---|---|---|
| 9,858,982 B1* | 1/2018 | Kim | ............ | G11C 11/406 |
| 11,094,369 B1* | 8/2021 | Joo | ............ | G11C 7/106 |
| 12,154,611 B2* | 11/2024 | Du | ............ | G11C 11/40611 |
| 2020/0327063 A1* | 10/2020 | Kang | ............ | G06F 12/0871 |
| 2021/0375346 A1* | 12/2021 | Lim | ............ | G11C 11/406 |
| 2022/0189533 A1* | 6/2022 | Kim | ............ | G11C 11/40603 |
| 2023/0154518 A1* | 5/2023 | Kim | ............ | G11C 11/40615 |
| | | | | 365/222 |

FOREIGN PATENT DOCUMENTS

| KR | 10-2020-0084599 A | 7/2020 |
|---|---|---|
| KR | 10-2020-0115115 A | 10/2020 |

* cited by examiner

*Primary Examiner* — Connie C Yoha
(74) *Attorney, Agent, or Firm* — IP & T GROUP LLP

(57) ABSTRACT

A memory system includes: a memory controller suitable for generating a first target address by sampling an address according to an active command, and providing the active command, a precharge command, a normal refresh command, the address and the first target address, to a memory device; and the memory device suitable for generating a first target refresh command according to the precharge command and the address, and refreshing one or more word lines corresponding to the first target address according to the first target refresh command.

24 Claims, 9 Drawing Sheets

SEMICONDUCTOR MEMORY DEVICE PERFORMING TARGET REFRESH AND MEMORY SYSTEM INCLUDING THE SAME

CROSS-REFERENCE TO RELATED APPLICATION

The present application claims the benefit of Korean Patent Application No. 10-2022-0000227, filed on Jan. 3, 2022, which is incorporated herein by reference in its entirety.

BACKGROUND

1. Field

Various embodiments of the present invention relate to a semiconductor design technology, and more particularly, to a memory system including a semiconductor memory device that performs a target refresh operation.

2. Description of the Related Art

Recently, in addition to a normal refresh operation for sequentially refreshing a plurality of word lines, an additional refresh operation which will be, hereinafter, referred to as a 'target refresh operation', is being performed on memory cells of a specific word line that is likely to lose data due to row hammering. The row hammering phenomenon refers to a phenomenon in which data of memory cells coupled to a specific word line or neighboring word lines disposed adjacent to the specific word line are damaged due to a high number of activations of the specific word line. In order to prevent the row hammering phenomenon, a target refresh operation is performed on a word line that is activated more than a predetermined number of times, and neighboring word lines disposed adjacent to the word line.

SUMMARY

Embodiments of the present invention are directed to a memory system capable of allowing a memory controller and a memory device to collaboratively generate target addresses, each target address for selecting at least one word line to be refreshed during a target refresh operation.

Embodiments of the present invention are directed to a memory system including a memory device capable of performing a target refresh operation by internally generating a target refresh command without receiving a separate target refresh command from a memory controller.

According to an embodiment of the present invention, a memory system includes a memory controller suitable for generating a first target address by sampling an address according to an active command, and providing the active command, a precharge command, a normal refresh command, the address and the first target address, to a memory device; and the memory device suitable for generating a first target refresh command according to the precharge command and the address, and refreshing one or more word lines corresponding to the first target address according to the first target refresh command.

According to an embodiment of the present invention, a semiconductor memory device includes a refresh command control circuit suitable for: generating a first target refresh command according to a mode entry signal that is generated by an address and a precharge command, generating a second target refresh command according to a normal refresh command, and generating a final target refresh command according to the first target refresh command or the second target refresh command; an active latch suitable for latching the address as an active address according to an active command; a refresh address control circuit suitable for: generating a first target address by latching the active address according to the mode entry signal, generating a second target address by randomly sampling the active address, and providing a row-hammer address by selecting one of the first target address and the second target address; and a row control circuit suitable for refreshing one or more word lines corresponding to the row-hammer address according to the final target refresh command.

According to an embodiment of the present invention, a semiconductor memory device includes a refresh command control circuit suitable for generating a target refresh command according to a mode entry signal that is generated by an address and a precharge command; an active latch suitable for latching the address as an active address according to an active command; a refresh address control circuit suitable for generating a target address by latching the active address according to the mode entry signal; and a row control circuit suitable for refreshing one or more word lines corresponding to the target address according to the target refresh command.

According to an embodiment of the present invention, an operating method of a memory device includes latching an address as an active address according to an active command; generating a mode entry signal according to a specific bit of the address and a precharge command; generating a first target refresh command by delaying the mode entry signal by a scheduled time; generating a first target address by latching the active address according to the mode entry signal; and refreshing one or more word lines corresponding to the first target address according to the first target refresh command.

According to an embodiment of the present invention, an operating method of a memory system includes providing, by a controller, a set of an indicator and a precharge command; and performing, by a memory device, a target refresh operation according to an active address in response to at least one of the set and a predetermined number of inputs of a refresh command.

According to embodiments of the present invention, the memory system may generate a final target address in a way that the memory controller may generate a first target address with a high number (or frequency) of activations and the memory device may generate a second target address with a random sampling. Since the memory controller and the memory device work together to sample the target addresses, the memory system may reduce the burden on the memory device while increasing the accuracy of the target refresh operation.

According to embodiments of the present invention, the memory device may perform the target refresh operation by internally generating the target refresh command without receiving the separate target refresh command from the memory controller, thereby preventing the performance drop that may occur due to issuance of the target refresh command from the memory controller.

DETAILED DESCRIPTION

Figure 1:
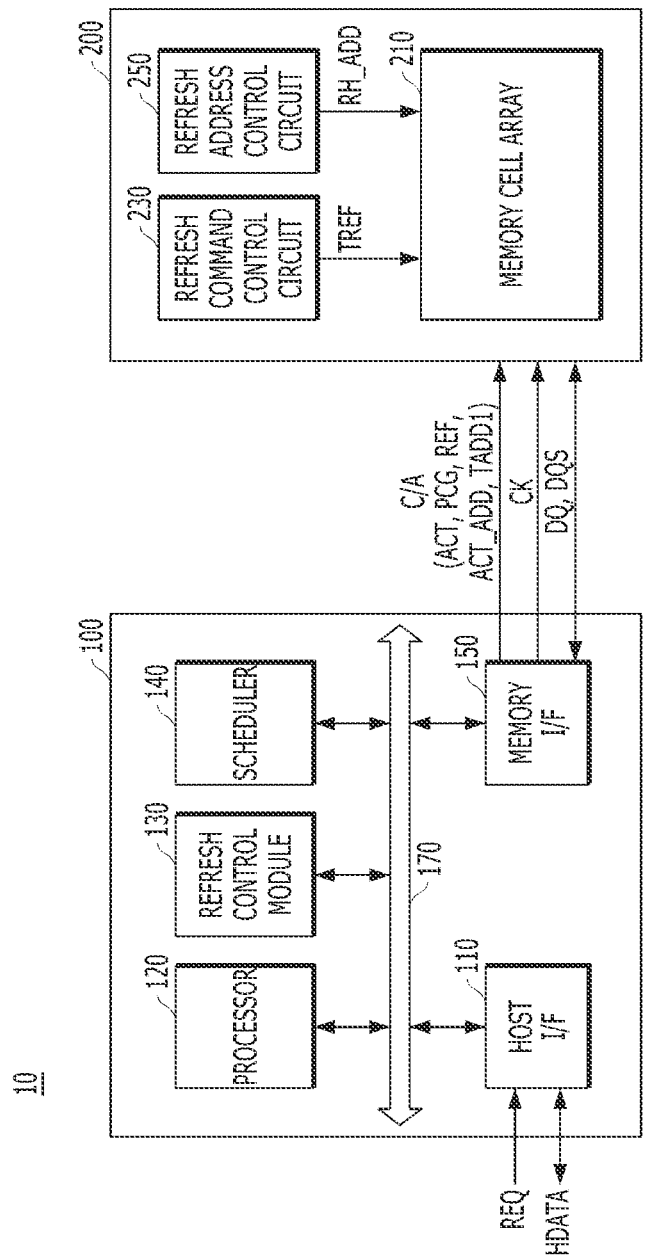
FIG. 1 is a block diagram illustrating a memory system in accordance with an embodiment of the present disclosure.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

In the following embodiments, in order to focus on a refresh operation, a description of a configuration related to a data input/output operation will be omitted and a row control operation will be mainly described.

FIG. 1 is a block diagram illustrating a memory system 10 in accordance with an embodiment of the present disclosure.

Referring to FIG. 1, the memory system 10 may include a memory controller 100, and a semiconductor memory device 200.

The memory controller 100 may control the general operation of the memory system 10 and it may control general data exchange between a host and the semiconductor memory device 200. The memory controller 100 may generate a command/address signal C/A according to a request REQ from the host, and provide the generated command/address signal C/A to the semiconductor memory device 200. The memory controller 100 may provide a clock CK together with the command/address signal C/A to the semiconductor memory device 200. The memory controller 100 may provide data DQ corresponding to host data HDATA provided from the host to the semiconductor memory device 200 together with a data strobe signal DQS. The memory controller 100 may receive the data DQ read from the semiconductor memory device 200 together with the data strobe signal DQS, and provide the data DQ and the data strobe signal DQS to the host as the host data HDATA.

In detail, the memory controller 100 may include a host interface (host I/F) 110, a processor 120, a refresh control module 130, a scheduler 140, a memory interface (memory I/F) 150, and a bus 170.

The host interface 110 may be configured to communicate with the host connected to the memory system 10 under the control of the processor 120. For example, the host interface 110 may receive the request REQ and the host data HDATA from the host, and provide the host data HDATA to the host by receiving the data DQ read from the semiconductor memory device 200 through the memory interface 150.

The processor 120 may perform various types of computational and/or other operations for controlling the semiconductor memory device 200, and/or may execute instructions in the form of firmware or other types of software. The processor 120 may receive the request REQ and the host data H DATA provided from the host through the host interface 110. The processor 120 may generate various commands and an address, corresponding to the request REQ, to provide the commands and the address to the refresh control module 130 and the scheduler 140. The processor 120 may transmit the host data HDATA to the memory interface 150. The various commands may include an active command ACT, a precharge command PCG, a normal refresh command REF, a read command, a write command, and the like. However, the proposed invention is not limited thereto, and the commands may include a command (e.g., a mode register set (MRS) command) required for an operation of the memory device 200. Hereinafter, the address generated with the active command ACT may be defined as an active address ACT_ADD. The processor 120 may control overall operations of the host interface 110, the refresh control module 130, the scheduler 140, and the memory interface 150.

The refresh control module 130 may generate a first target address TADD1 by sampling the active address ACT_ADD according to the active command ACT. The memory controller 100 may provide the semiconductor memory device 200 with the first target address TADD1 apparently as an active address ACT_ADD (together with the active command ACT). As described later with reference to FIGS. 3 and 7, the semiconductor memory device 200 may latch this apparent active address ACT_ADD as the first target address TADD1 according to a mode entry signal PCG_FL. The refresh control module 130 may count the number of inputs of the active address ACT_ADD according to the active command ACT to thereby generate the first target address TADD1 with a high number of activations or high frequency of activations. A detailed configuration of the refresh control module 130 in accordance with the embodiment will be described in FIG. 2.

The scheduler 140 may generate the command/address signal C/A by scheduling the commands and address provided from the processor 120 and the refresh control module 130. The scheduler 140 may provide the active address ACT_ADD together with the active command ACT as the command/address signal C/A, and provide the address together with the precharge command PCG as the command/address signal C/A. In particular, in accordance with an embodiment, the scheduler 140 may provide the first target address TADD1 as the active address ACT_ADD, together with the active command ACT as the command/address signal C/A. After a predetermined time from a time point when the first target address TADD1 as the active address ACT_ADD, is provided together with the active command ACT as the command/address signal C/A, the scheduler 140 may set a specific bit of the address to a high bit and provide the address together with the precharge command PCG as the command/address signal C/A. At this time, the predetermined time may correspond to a time (tRAS, a minimum row address strobe time) to be secured to complete a read or write operation after an active operation. The scheduler 140 may provide the address together with the write command as the command/address signal C/A, provide the read command as the command/address signal C/A, and provide the normal refresh command REF as the command/address signal C/A. Further, the scheduler 140 may provide the address together with the command (e.g., the MRS command) required for an operation of the memory device 200, as the command/address signal C/A.

The memory interface 150 may be configured to communicate with the semiconductor memory device 200 under the control of the is processor 120. For example, the memory interface 150 may transmit the command/address signal C/A and the data DQ to the semiconductor memory device 200, and transmit the data DQ read from the semiconductor memory device 200 to the host interface 110.

The processor 120 may transmit data between the host interface 110, the refresh control module 130, the scheduler 140, and the memory interface 150 via the bus 170. According to an embodiment, the host interface 110, the refresh control module 130, the scheduler 140, and the memory interface 150 may communicate with each other independently without passing through the bus 170. For example, the refresh control module 130 and host interface 110 may communicate directly with each other without passing through the bus 170. The refresh control module 130 and the memory interface 150 may communicate with each other directly without passing through the bus 170. The host interface 110 and the memory interface 150 may also communicate directly with each other without passing through the bus 170.

The semiconductor memory device 200 may perform a refresh operation, a write operation, and a read operation according to the dock CK, the command/address signal C/A, the data strobe signal DQS, and/or the data DQ that are provided from the memory controller 100. The refresh operation may include a normal refresh operation in which the semiconductor memory device 200 sequentially refreshes a plurality of word lines during a normal refresh period, and a target refresh operation in which one or more neighboring word lines disposed adjacent to a word line having a large number (or frequency) of activations are refreshed, during a target refresh period.

The semiconductor memory device 200 may generate an internal command (ICMD of FIG. 3) and an internal address (IADD of FIG. 3) by buffering the command/address signal C/A, and generate an active command ACT, a precharge command PCG, a normal refresh command REF, which are related to a row control operation, by decoding the command ICMD. According to the active command ACT, the semiconductor memory device 200 may latch the internal address IADD as the active address ACT_ADD or the first target address TADD1. The semiconductor memory device 200 may generate a second target address (TADD2 of FIG. 3) by sampling the active address ACT_ADD according to the active command ACT. The semiconductor memory device 200 may generate a first target refresh command (TREF1 of FIG. 3) according to the precharge command PCG and the internal address IADD, and may generate a second target refresh command (TREF2 of FIG. 3) according to the normal refresh command REF.

The semiconductor memory device 200 may perform the normal refresh operation according to the normal refresh command REF and perform the target refresh operation according to the first target refresh command TREF1 or the second target refresh command TREF2. The semiconductor memory device 200 may perform the target refresh operation for refreshing one or more neighboring word lines of a target word line corresponding to the first target address TADD1 in response to the first target refresh command TREF1, or perform the target refresh operation for refreshing one or more neighboring word lines of a target word line corresponding to the second target address TADD2 in response to the second target refresh command TREF2. That is, the semiconductor memory device 200 may perform the target refresh operation according to the first target refresh command TREF1 or the second target refresh command TREF2 without receiving a separate target refresh command generated by the memory controller 100.

Further, the semiconductor memory device 200 may additionally generate commands related to data input/output operations (e.g., a read command or a write command) by decoding the internal command ICMD.

In detail, the semiconductor memory device 200 may include a memory cell array 210, a refresh command control circuit 230 and a refresh address control circuit 250.

The memory cell array 210 may include a plurality of memory cells coupled to a plurality of word lines and a plurality of bit lines, and may be arranged in the form of an array.

The refresh command control circuit 230 may generate the first target refresh command TREF1 according to a specific bit of the internal address IADD when the precharge command PCG is inputted. For example, the refresh command control circuit 230 may generate the first target refresh command TREF1 by delaying the specific bit of the internal address IADD by a scheduled time when the precharge command PCG is inputted. At this time, the scheduled time may correspond to a time (tRP, a precharge to active time) to an active operation from the precharge operation, which is defined in the specification. The refresh command control circuit 230 may generate the second target refresh command TREF2 whenever the number of inputs of the normal refresh command REF reaches a preset number. The refresh command control circuit 230 may generate a final target refresh command TREF according to the first target refresh command TREF1 or the second target refresh command TREF2.

The refresh address control circuit 250 may provide a row-hammer address RH_ADD for selecting one or more word lines to be refreshed among the plurality of word lines during the target refresh operation. The refresh address control circuit 250 may generate the second target address TADD2 by randomly sampling the active address ACT_ADD, and may provide the row-hammer address RH_ADD by selecting one of the first target address TADD1 and the second target address TADD2.

With the above configuration, the refresh address control circuit 250 may perform the normal refresh operation for sequentially refreshing the world lines according to the normal refresh command REF, and perform the target refresh operation on the neighboring word lines corresponding to the row-hammer address RH_ADD according to the final target refresh command TREF. A detailed configuration of the semiconductor memory device 200 in accordance with the embodiment will be described in FIGS. 3 to 8.

As described above, in accordance with an embodiment of the present invention, the memory controller 100 may generate the first target address TADD1 as the active address ACT_ADD, with a high number (or frequency) of activations, and the semiconductor memory device 200 may generate the second target address TADD2 with a random sampling, thereby generating the row-hammer address RH_ADD. Since the memory controller and the memory device work together to generate row-hammer address RH_ADD, the memory system 10 may reduce the burden on the semiconductor memory device 200 while increasing the accuracy of the target refresh operation. In addition, the memory controller 100 may transfer the first target address TADD1 as the active address ACT_ADD, to the memory device 200 using the existing active command ACT without generating a separate target refresh command, and the memory device 200 may refresh the word line corresponding to the first target address TADD1 according to the target refresh command internally generated using the existing precharge command PCG. Thus, it is possible to prevent a performance drop that may occur due to issuance of the target refresh command.

Figure 2:
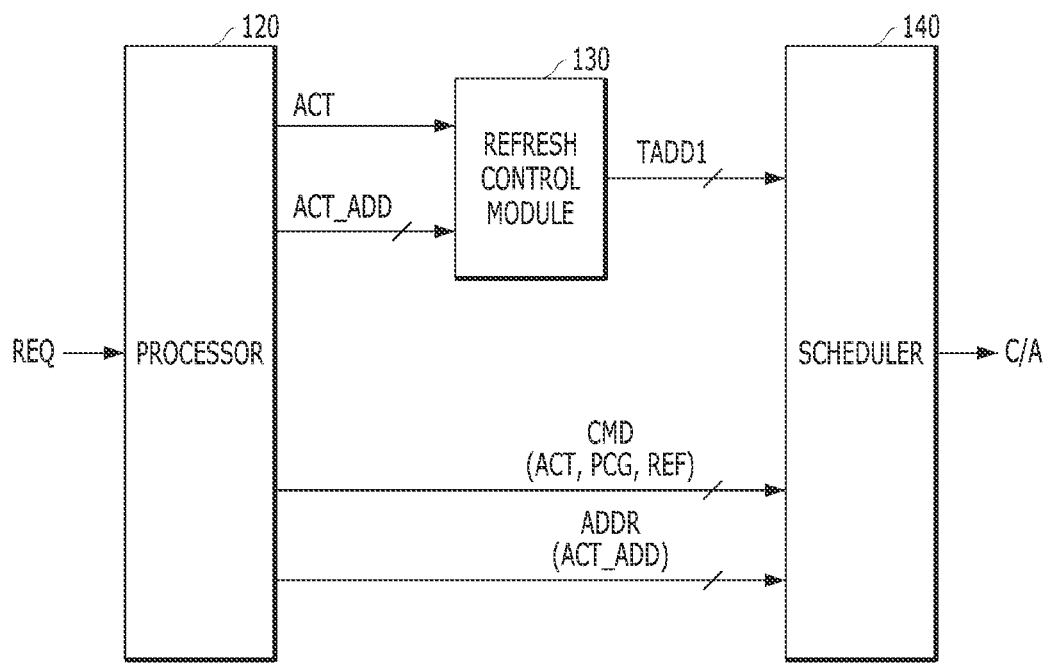
FIG. 2 is a block diagram illustrating a memory controller shown in FIG. 1 in accordance with an embodiment of the present disclosure.

FIG. 2 is a block diagram illustrating the memory controller 100 shown in FIG. 1 in accordance with an embodiment of the present disclosure. In FIG. 2, to focus on the characteristics of the embodiment, additional configurations, e.g., the host interface 110 and the memory interface 150, have been omitted.

Referring to FIG. 2, the processor 120 may receive the request REQ from the host through the host interface 110. The processor 120 may generate the active command ACT and the active address ACT_ADD corresponding to the request REQ. The processor 120 may generate a set number of the normal refresh commands REF during a predetermined period. The set number of the normal refresh commands REF and the predetermined period may be determined depending on a specification. For example, the processor 120 may generate 8192 normal refresh commands REF for sequentially refreshing a plurality of word lines of the memory device 200, during a refresh period of 64 ms.

The refresh control nodule 130 may generate the first target address TADD1 by sampling the active address ACT_ADD in response to the active command ACT. The refresh control module 130 may output the first target address TADD1 with a high number (or frequency) of activations. Depending on an embodiment, the refresh control module 130 may generate the first target address TADD1 based on a priority address generated by counting the number of accesses of only a few bits of the active address ACT_ADD and a plurality of sampling addresses generated by randomly sampling the active address ACT_ADD. The refresh control module 130 may randomly sample the active address ACT_ADD by using a linear feedback shift register (LFSR) based random pattern generator.

The scheduler 140 may generate the command/address signal C/A by scheduling the commands CMD (e.g., the active command, the precharge command, the normal refresh command REF, and the like) and the address ADDR (e.g., the active address ACT_ADD) provided from the processor 120, and the first target address TADD1 provided from the refresh control module 130. The scheduler 140 may provide the active address ACT_ADD or the first target address TADD1 as the active address ACT_ADD, together with the active command ACT as the command/address signal C/A, and provide the address ADDR together with the precharge command PCG as the command/address signal C/A. In particular, in accordance with the embodiment, the scheduler 140 may provide the first target address TADD1 as the active address ACT_ADD, together with the active command ACT as the command/address signal C/A. After a predetermined time from a time point when the first target address TADD1 is provided together with the active command ACT as the command/address signal C/A, the scheduler 140 may set a specific bit of the address ADDR to a high bit and provide the address having the specific bit value, together with the precharge command PCG as the command/address signal C/A. The scheduler 140 may provide the normal refresh command REF as the command/address signal C/A. As described later, the semiconductor memory device 200 may regard the active address ACT_ADD as the first target address TADD1 based on the address having the specific bit value and provided together with the precharge command PCG.

Figure 3:
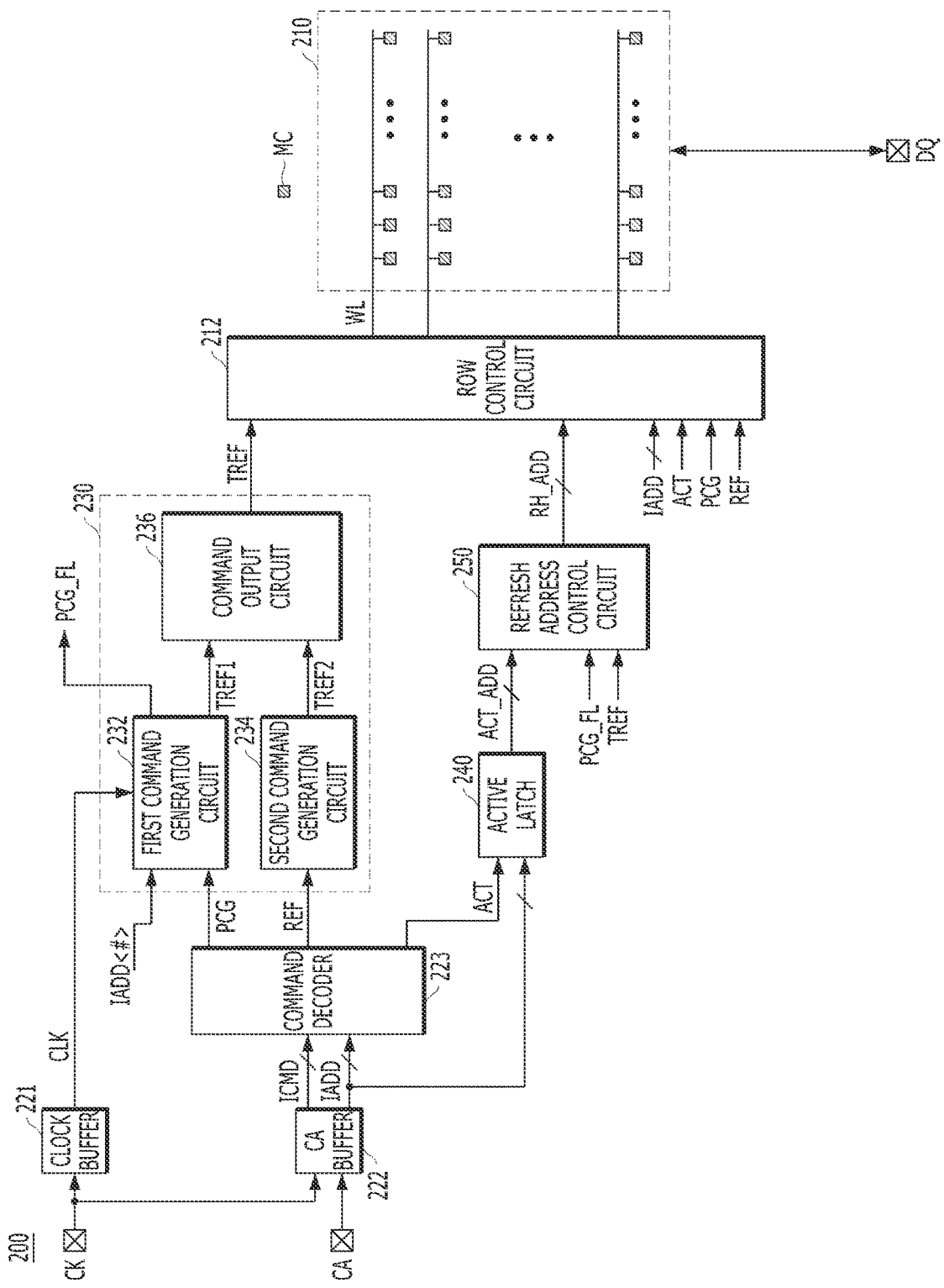
FIG. 3 is a block diagram illustrating a memory device shown in FIG. 1 in accordance with an embodiment of the present disclosure.

FIG. 3 is a block diagram illustrating the semiconductor memory device 200 shown in FIG. 1 in accordance with an embodiment of the present disclosure.

Referring to FIG. 3, the semiconductor memory device 200 may include the memory cell array 210, a row control circuit 212, a clock buffer 221, a command/address (CA) buffer 222, a command decoder 223, the refresh command control circuit 230, an active latch 240, and the refresh address control circuit 250.

The memory cell array 210 may include a plurality of memory cells MC coupled to word lines WL and bit lines arranged in the form of an array. The memory cell array 210 may be composed of at least one bank. The number of banks or the number of memory cells MC may be determined depending on the capacity of the semiconductor memory device 200.

The clock buffer 221 may receive a dock CK from the memory controller 100. The clock buffer 221 may generate an internal dock CLK by buffering the dock CK. Depending on an embodiment, the memory controller 100 may transfer system docks CK_t and CK_c to the semiconductor memory device 200 in a differential manner, and the semiconductor memory device 200 may include clock buffers that receive the differential clocks CK_t and CK_c, respectively.

The CA buffer 222 may receive a command/address signal C/A from the memory controller 100 based on the dock CK. The CA buffer 222 may sample the command/address signal C/A based on the clock CK and output an internal command ICMD and an internal address IADD. Consequently, the semiconductor memory device 200 may be synchronized with the clock CK.

The command decoder 223 may decode the internal command ICMD which is output from the CA buffer 222 to generate an active command ACT, a precharge command PCG, and a normal refresh command REF. Although not illustrated, the command decoder 223 may additionally generate a read command, a write command, a mode register command MRS, and the like by decoding the internal command ICMD.

According to the precharge command PCG and a specific bit IADD<#> of the internal address IADD, the refresh command control circuit 230 may generate a mode entry signal PCG_FL and a first target refresh command TREF1. The refresh command control circuit 230 may generate a second target refresh command TREF2 according to the normal refresh command REF. The refresh command control circuit 230 may generate a final target refresh command TREF according to the first target refresh command TREF1 or the second target refresh command TREF2.

In detail, the refresh command control circuit 230 may include a first command generation circuit 232, a second command generation circuit 234, and a command output circuit 236.

The first command generation circuit 232 may generate the mode entry signal PCG_FL according to the specific bit IADD<#> of the internal address IADD when the precharge command PCG is inputted, and output the first target refresh command TREF1 by delaying the mode entry signal PCG_FL by a scheduled time. For example, the first command generation circuit 232 may enable the mode entry signal PCG_FL in case where a fifth bit IADD<5> of the internal address IADD when the precharge command PCG is inputted is set to a high bit. Preferably, the scheduled time may correspond to a time (tRP, a precharge to active time) from the precharge operation, which is defined in the specification. That is, in a case where the fifth bit IADD<5> of the internal address IADD has a high bit value when the precharge command PCG is inputted, the first command generation circuit 232 may output the first target refresh command TREF1 after the precharge to active time tRP from an input of the precharge command PCG.

The second command generation circuit 234 may generate the second target refresh command TREF2 whenever the number of inputs of the normal refresh command REF reaches the preset number of times.

The command output circuit 236 may generate the final target refresh command TREF when one of the first target refresh command TREF1 and the second target refresh command TREF2 is generated.

The active latch 240 may latch the internal address IADD as an active address ACT_ADD according to the active command ACT.

The refresh address control circuit 250 may latch, as the first target address TADD1, the active address ADD_ACT according to the mode entry signal PCG_FL. The semiconductor memory device 200 may regard the active address ACT_ADD as the first target address TADD1 based on the mode entry signal PCG_FL, which is activated according to the address having the specific bit value (i.e., the fifth bit IADD<5> having a high bit value within the internal address IADD) and provided together with the precharge command PCG. The refresh address control circuit 250 may generate a second target address TADD2 by randomly sampling the active address ADD_ACT. The refresh address control circuit 250 may output a final target address TADD by selecting one of the first target address TADD1 and the second target address TADD2 according to a period selection signal (P_SEL of FIG. 7) that is defined by the mode entry signal PCG_FL and the final target refresh command TREF. The refresh address control circuit 250 may calculate and output a row-hammer address RH_ADD from the final target address TADD. Although FIG. 3 shows that the active latch 240 is illustrated as a separate configuration from the refresh address control circuit 250, the present invention is not limited thereto, and the active latch 240 may be included in the refresh address control circuit 250.

The row control circuit 212 may activate a word line WL corresponding to the internal address IADD according to the active command ACT, and precharge the activated word line WL according to the precharge command PCG. In order to select a word line to be refreshed during a normal refresh operation, a refresh counter (not shown) for generating a counting address that is sequentially increasing according to the normal refresh command REF may be additionally provided. The row control circuit 212 may perform the normal refresh operation of sequentially refreshing the plurality of word lines WL corresponding to the counting address according to the normal refresh command REF. The row control circuit 212 may perform a target refresh operation of refreshing one or more neighboring word lines corresponding to the row-hammer address RH_ADD according to the final target refresh command TREF.

Though it is not shown, the memory device 200 may further include a column control circuit for selecting bit lines corresponding to the column address among the internal address IADD, according to the read command or the write command. The memory device 200 may output data DQ read from the memory cell array 210 through the bit lines, under the control of the column control circuit, together with a data strobe signal DQS to the memory interface 150 of the memory controller 100.

Figure 4:
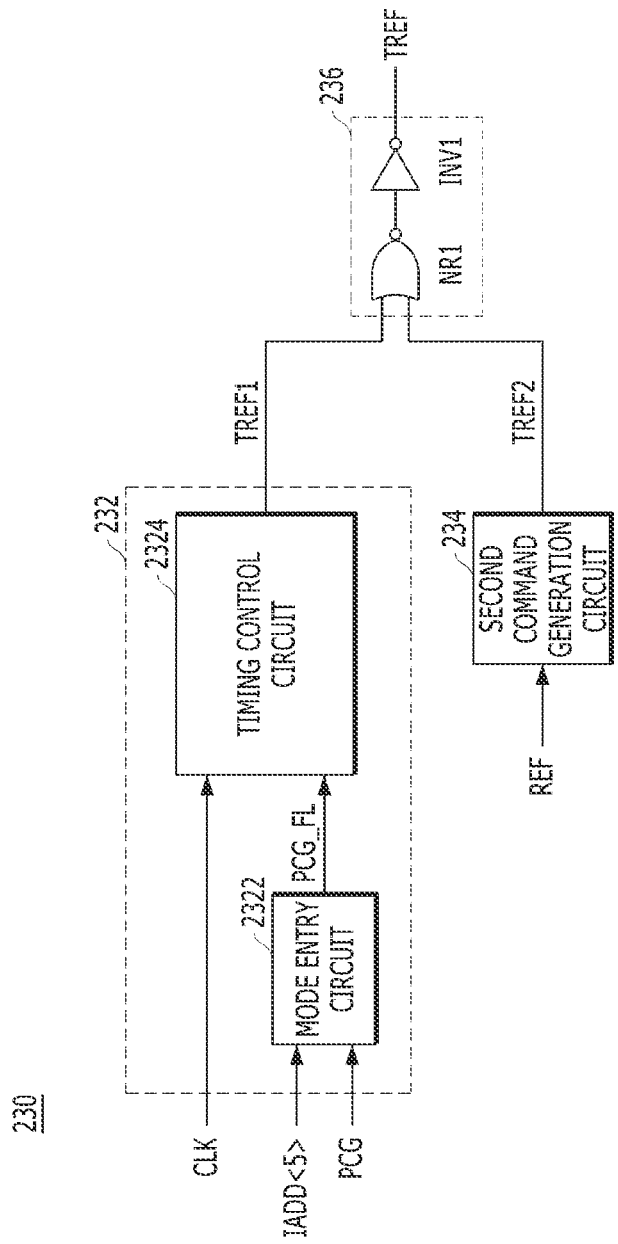
FIG. 4 is a detailed block diagram illustrating a refresh command control circuit of FIG. 3 in accordance with an embodiment of the present disclosure.

FIG. 4 is a detailed block diagram illustrating the refresh command control circuit 230 of FIG. 3 in accordance with an embodiment of the present disclosure.

Referring to FIG. 4, the first command generation circuit 232 may include a mode entry circuit 2322 and a timing control circuit 2324.

The mode entry circuit 2322 may generate the mode entry signal PCG_FL according to the specific bit IADD<#> of the internal address IADD when the precharge command PCG is inputted. The mode entry circuit 2322 may enable the mode entry signal PCG_FL for a predetermined section in a case where a fifth bit IADD<5> of the internal address IADD when the precharge command PCG is inputted is set to a high bit.

The timing control circuit 2324 may output the first target refresh command TREF1 by delaying the mode entry signal PCG_FL by the precharge to active time tRP. Depending on an embodiment, the timing control circuit 2324 may delay the mode entry signal PCG_FL in synchronization with the internal dock CLK. Thus, after a precharge operation according to the precharge command PCG is performed for the precharge to active time tRP defined in the specification, a target refresh operation according to the first target refresh command TREF1 may be performed.

The second command generation circuit 234 may count the number of inputs of the normal refresh command REF, and generate the second target refresh command TREF2 whenever the counted number reaches a predetermined number of times. For example, the second command generation circuit 234 may include a counter for counting the number of inputs of the normal refresh command REF.

The command output circuit 236 may generate the final target refresh command TREF when one of the first target refresh command TREF1 and the second target refresh command TREF2 is generated. The command output circuit 236 may include logic gates for performing a logic OR operation on the first target refresh command TREF1 and the second target refresh command TREF2. For example, the command output circuit 236 may include a NOR gate NR1 for performing a logic NOR operation on the first target refresh command TREF1 and the second target refresh command TREF2, and an inverter INV1 for inverting an output of the NOR gate NR1, thereby outputting the final target refresh command TREF.

Figure 5:
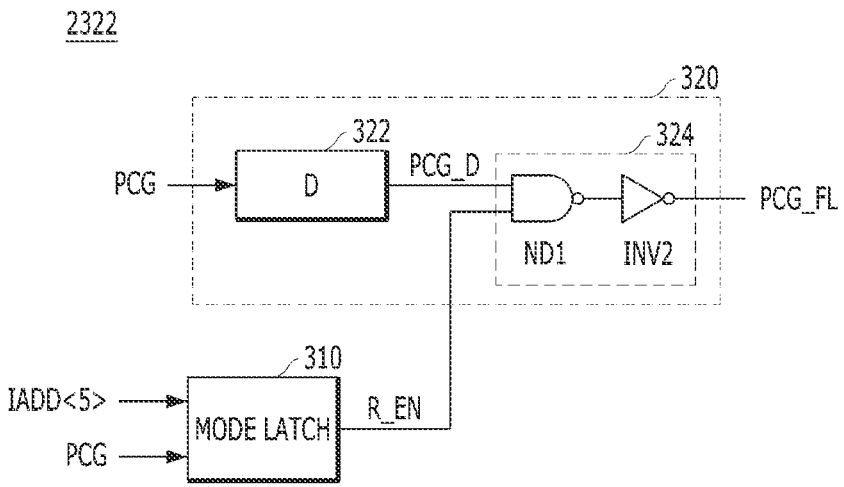
FIG. 5 is a circuit diagram illustrating a mode entry circuit of FIG. 4 in accordance with an embodiment of the present disclosure.

FIG. 5 is a circuit diagram illustrating the mode entry circuit 2322 of FIG. 4 in accordance with an embodiment of the present disclosure.

Referring to FIG. 5, the mode entry circuit 2322 includes a mode latch 310 and a pulse generator 320.

The mode latch 310 may generate a mode enable signal R_EN by latching the fifth bit IADD<5> of the internal address IADD according to the precharge command PCG.

The pulse generator 320 may generate the mode entry signal PCG_FL by delaying the precharge command PCG by a certain delay amount according to the mode enable signal R_EN. The pulse generator 320 may include a delay (D) 322, and a pulse output part 324. The delay 322 may delay the precharge command PCG by the certain delay amount to output a delayed precharge command PCG_D. The certain delay amount may be set for synchronization with the mode enable signal R_EN, and may be varied by a desired delay amount. The delayed precharge command PCG_D may be enabled for a section corresponding to the certain delay amount. The pulse output part 324 may output the delayed precharge command PCG_D as the mode entry signal PCG_FL when the mode enable signal R_EN is enabled. The pulse output part 324 may include logic gates for performing a logic AND operation on the delayed precharge command PCG_D and the mode enable signal R_EN. For example, the pulse output part 324 may include a NAND gate ND1 for performing a logic NAND operation on the delayed precharge command PCG_D and the mode enable signal R_EN, and an inverter INV2 for inverting an output of the NAND gate ND1, thereby outputting the mode entry signal PCG_FL.

Figure 6:
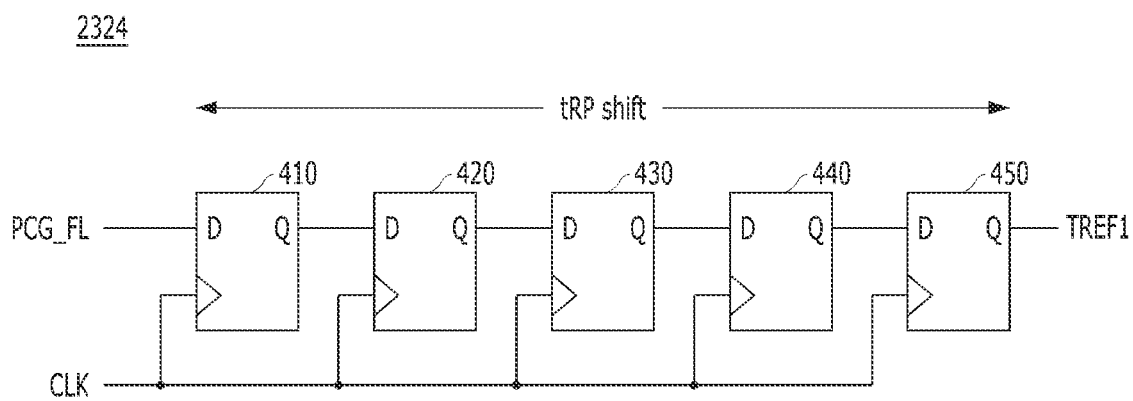
FIG. 6 is a circuit diagram illustrating a timing control circuit of FIG. 4 in accordance with an embodiment of the present disclosure.

FIG. 6 is a circuit diagram illustrating the timing control circuit 2324 of FIG. 4 in accordance with an embodiment of the present disclosure.

Referring to FIG. 6, the timing control circuit 2324 may include a plurality of D-flip flops 410 to 450 which are coupled in series, each for transferring an input signal at an input node (D) to an output node (Q) according to the internal clock CLK at a clock node. For example, the timing control circuit 2324 may include first to fifth D-flip flops 410 to 450. The first D-flip flop 410 may receive the mode entry signal PCG_FL at its input node (D), and the fifth D-flip flop 450 may output the first target refresh command TREF1 at its output node (Q).

At this time, the number of the D flip-flops 410 to 450 may be set depending on the precharge to active time tRP. That is, the number of D-flip flops 410 to 450 may be set such that the sum of the delay amounts due to the D-flip flops 410 to 450 becomes the precharge to active time tRP.

With the above configuration, when the precharge command PCG is inputted, the refresh command control circuit 230 may generate the first target refresh command TREF1 according to the specific bit IADD<#> of the internal address IADD at a time point when the precharge command PCG is delayed by the precharge to active time tRP. The refresh command control circuit 230 may generate the second target refresh command TREF2 whenever the number of inputs of the normal refresh command REF reaches the preset number of times. The refresh command control circuit 230 may generate the final target refresh command TREF according to the first target refresh command TREF1 or the second target refresh command TREF2.

Figure 7:
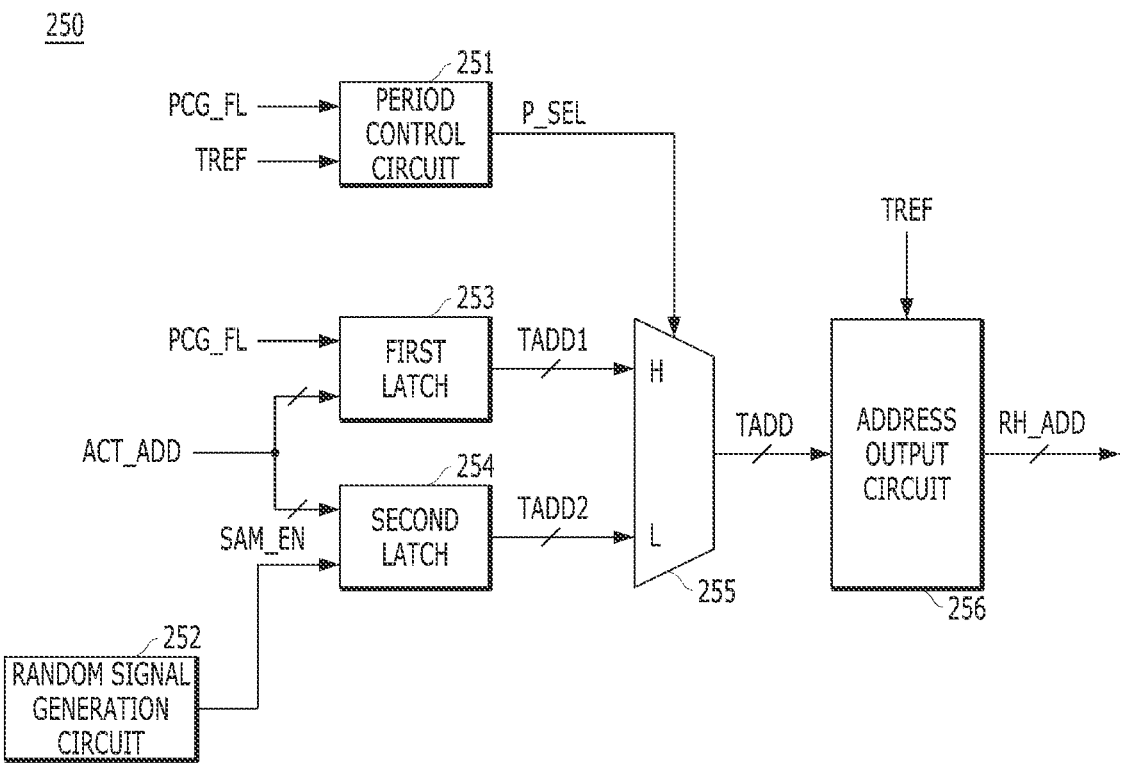
FIG. 7 is a detailed block diagram illustrating a refresh address control circuit of FIG. 3 in accordance with an embodiment of the present disclosure.

FIG. 7 is a detailed block diagram illustrating the refresh address control circuit 250 of FIG. 3 in accordance with an embodiment of the present disclosure.

Referring to FIG. 7, the refresh address control circuit 250 may include a period control circuit 251, a random signal generation circuit 252, a first latch 253, a second latch 254, a selection circuit 255, and an address output circuit 256.

The period control circuit 251 may generate the period selection signal P_SEL that is defined by the mode entry signal PCG_FL and the final target refresh command TREF. The period control circuit 251 may generate the period selection signal P_SEL that is enabled by the mode entry signal PCG_FL and disabled by the final target refresh command TREF. The period control circuit 251 may disable the period selection signal P_SEL according to a falling edge of the final target refresh command TREF.

The random signal generation circuit 252 may generate a sampling signal SAM_EN that is randomly toggling. Depending on an embodiment, the random signal generation circuit 252 may generate the sampling signal SAM_EN based on the internal clock CLK. The random signal generation circuit 252 may be implemented with a pseudo-random binary sequence (PRBS) based random pattern generator.

The first latch 253 may latch, as the first target address TADD1, the active address ADD_ACT according to the mode entry signal PCG_FL. The semiconductor memory device 200 may regard the active address ACT_ADD as the first target address TADD1 based on the mode entry signal PCG_FL, which is activated according to the address having the specific bit value (i.e., the fifth bit IADD<5> having a high bit value within the internal address IADD) and provided together with the precharge command PCG.

The second latch 254 may latch, as the second target address TADD2, the active address ADD_ACT according to the sampling signal SAM_EN.

The selection circuit 255 may output the final target address TADD by selecting one of the first target address TADD1 and the second target address TADD2 according to the period selection signal P_SEL. When the period selection signal P_SEL, is enabled to a logic high level, the selection circuit 255 may output the first target address TADD1 as the final target address TADD. When the period selection signal P_SEL is disabled to a logic low level, the selection circuit 255 may output the second target address TADD2 as the final target address TADD.

The address output circuit 256 may calculate the row-hammer address RH_ADD from the final target address TADD, and output the row-hammer address RH_ADD according to the final target address TADD, For example, the address output circuit 256 may calculate the row-hammer address RH_ADD for designating one or more neighboring word lines by increasing or decreasing the final target address TADD by "+1". Depending on an embodiment, the address output circuit 256 may output the final target address TADD as the row-hammer address RH_ADD without calculating the row-hammer address RH_ADD.

Figure 8:
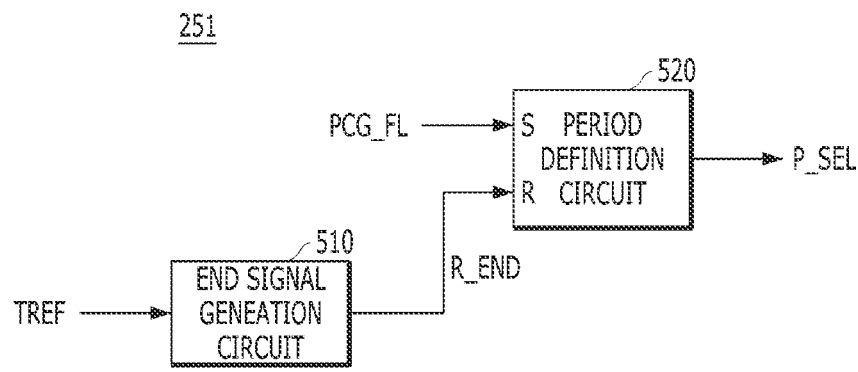
FIG. 8 is a detailed block diagram illustrating a period control circuit of FIG. 7 in accordance with an embodiment of the present disclosure.

FIG. 8 is a detailed block diagram illustrating the period control circuit 251 of FIG. 7 in accordance with an embodiment of the present disclosure.

Referring to FIG. 8, the period control circuit 251 may include an end signal generation circuit 510 and a period definition circuit 520.

The end signal generation circuit 510 may generate a mode end signal R_END that is enabled according to a falling edge of the final target refresh command TREF. The period definition circuit 520 may generate the period selection signal P_SEL according to the mode entry signal PCG_FL and the mode end signal R_END. The period definition circuit 520 may generate the period selection signal P_SEL that is enabled by the mode entry signal PCG_FL and disabled by the mode end signal R_END. For example, the period definition circuit 520 may be implemented with an SR latch.

With the above configuration, the refresh address control circuit 250 may latch, as the first target address TADD1, the active address ADD_ACT according to the mode entry signal PCG_FL, and may generate the second target address TADD2 by randomly sampling the active address ADD_ACT. The refresh address control circuit 250 may output the final target address TADD by selecting one of the first target address TADD1 and the second target address TADD2 according to a period selection signal P_SEL, and may calculate and output a row-hammer address RH_ADD from the final target address TADD.

Hereinafter, referring to FIGS. 1 to 11, an operation of a memory system will be described.

Figure 9:
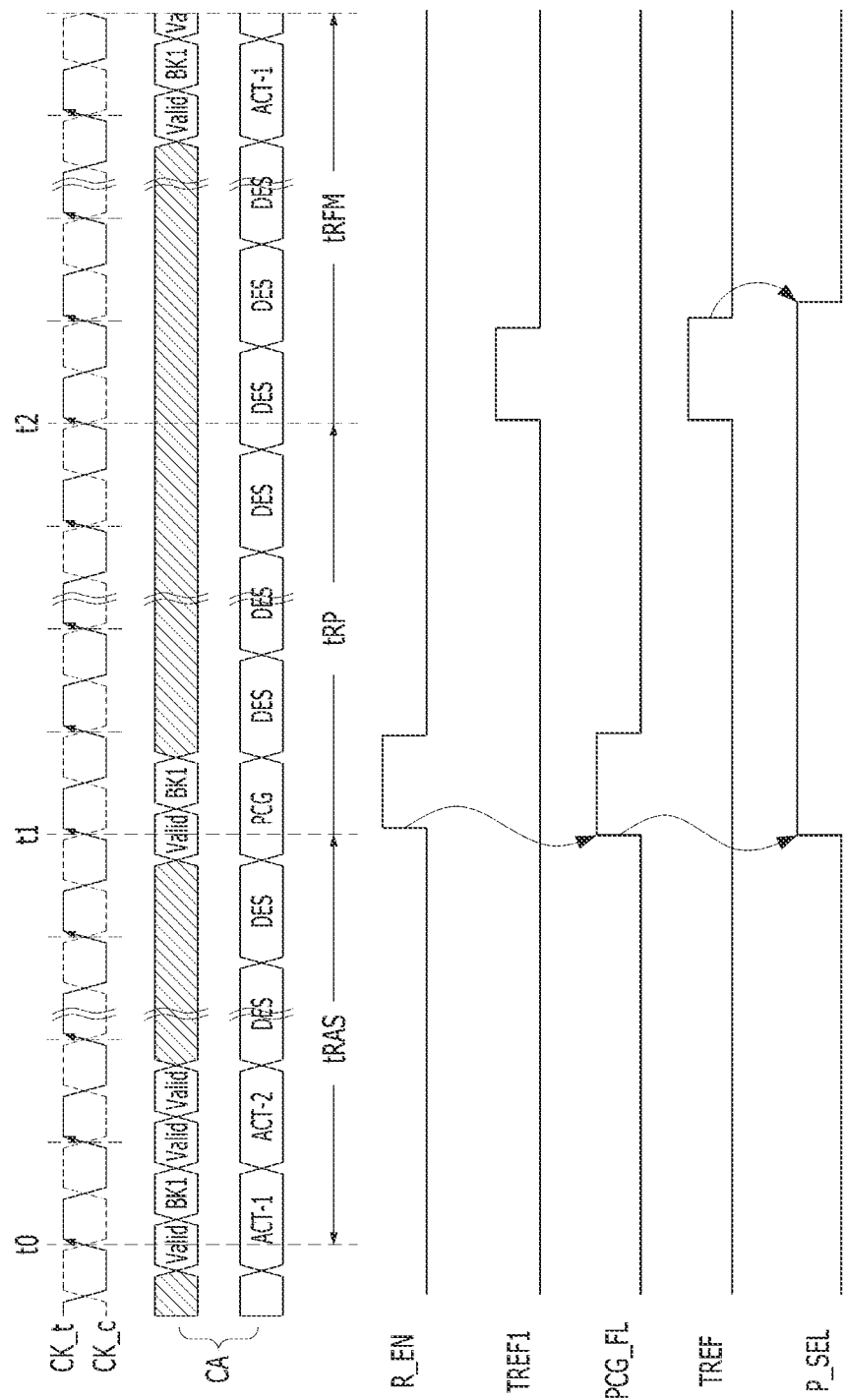
FIG. 9 is a timing diagram for describing an operation of a memory device in accordance with an embodiment of the present disclosure.
Figure 10:
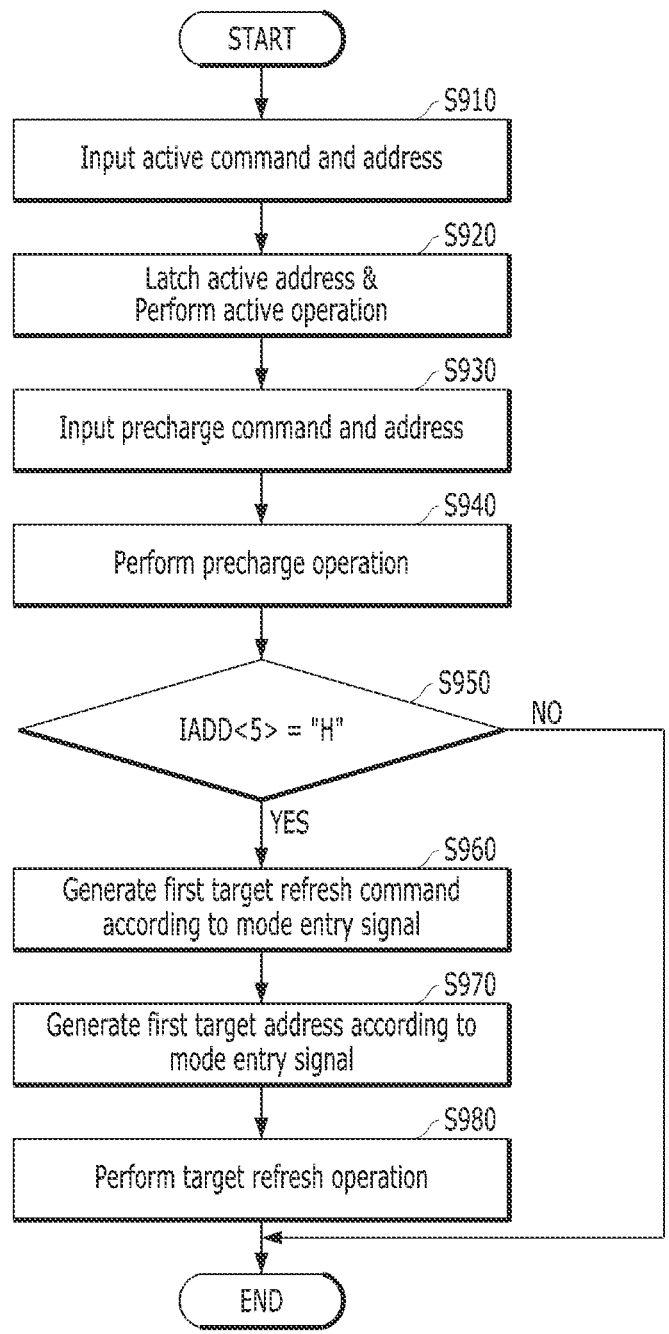
FIGS. 10 and 11 are flow charts for describing an operation of a memory device in accordance with an embodiment of the present disclosure.
Figure 11:
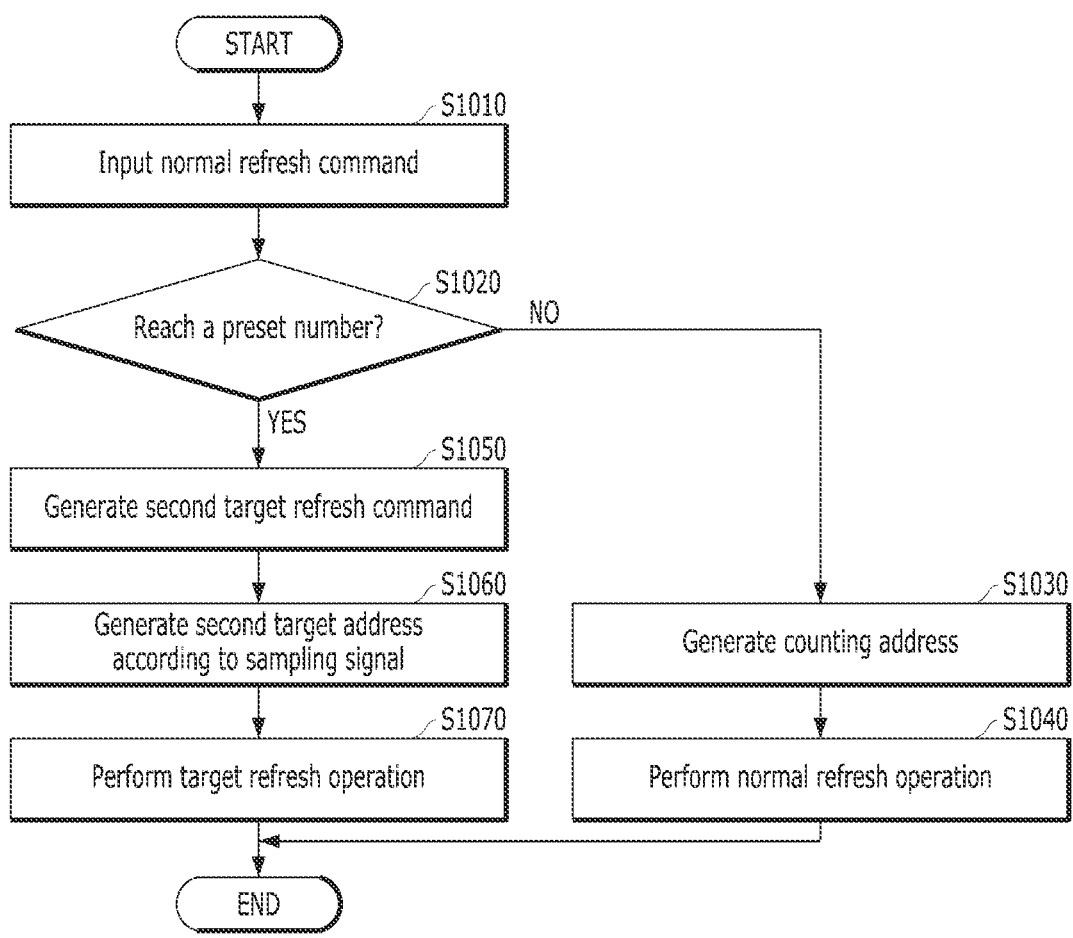

FIG. 9 is a timing diagram for describing an operation of a memory device in accordance with an embodiment of the present disclosure, FIGS. 10 and 11 are flow charts for describing an operation of a memory device in accordance with an embodiment of the present disclosure.

Referring to FIGS. 9 and 10, a target refresh operation according to the first target refresh command TREF1 is shown.

The memory controller 100 may generate the first target address TADD1 by sampling the active address ACT_ADD according to the active command ACT.

The memory controller 100 may provide the command/address signal C/A including the first target address TADD1 as the active address ACT_ADD, or the actual active address ACT_ADD together with the active command ACT, and the docks CK_t and CK_c, to the semiconductor memory device 200 (at S910). At this time, the address provided together with the active command ACT may be the actual active address ACT_ADD or the first target address TADD1 shown as the active address ACT_ADD. For reference, FIG. 9 illustrates a case where the active command ACT is divided into reference numerals "ACT-1" and "ACT-2" and is provided two times, and the address is also provided two times together with the active commands "ACT-1" and "ACT-2". However, the present invention is not limited thereto, and the active command ACT may be provided according to a rule specified in the specification.

At a first timing t0, the CA buffer 222 may sample the command/address signal C/A based on the clocks CK_t and CK_c and output the internal command ICMD and the internal address IADD. The command decoder 223 may decode the internal command ICMD to generate the active command ACT. The row control circuit 212 may activate a word line WL corresponding to the internal address IADD according to the active command ACT (at S920). Further, the active latch 240 may latch the internal address IADD as the active address ACT_ADD according to the active command ACT, to thereby perform an active operation (at S920).

After the minimum row address strobe time (tRAS) has elapsed, the memory controller 100 may provide the command/address signal C/A including the address together with the precharge command PCG, and the docks CK_t and to the semiconductor memory device 200 (at S930). The internal address IADD corresponding to the address provided together with the precharge command PCG at operation S930 may have a specific bit value (e.g., the fifth bit IADD<5> having a high bit value) when the active address ACT_ADD provided from the memory controller 100 is actually the first target address TADD1.

At a second timing t1, the semiconductor memory device 200 may generate the precharge command PCG. The row control circuit 212 may deactivate the word line WL corresponding to the internal address IADD according to the precharge command PCG, to thereby perform a precharge operation (at S940).

At this time, in a case where the specific bit IADD<#> (i.e., the fifth bit IADD<5>) of the internal address IADD, which corresponds to the address provided together with the precharge command PCG at operation S930, is set to a low bit ("NO" of S950), it is determined that the active address ACT_ADD provided together with the active command ACT, at the first timing t0, is the actual active address ACT_ADD. Thus, after the precharge operation, the process is finished.

On the contrary, in case where the specific bit IADD<#> (i.e., the fifth bit IADD<5>) of the internal address IADD, which corresponds to the address provided together with the precharge command PCG at operation S930, is set to a high bit ("YES" of S950), it is determined that the active address ACT_ADD provided together with the active command ACT, at the first timing t0, is actually the first target address TADD1, The mode entry circuit 2322 of the refresh command control circuit 230 may generate the mode enable signal R_EN by latching the fifth bit IADD<5> of the internal address IADD, and generate the mode entry signal PCG_FL by delaying the precharge command PCG according to the mode enable signal R_EN. The timing control circuit 2324 may output the first target refresh command TREF1, at a third timing t2, by delaying the mode entry signal PCG_FL by the precharge to active time tRP (at S960). The command output circuit 236 may output the first target refresh command TREF1 as the final target refresh command TREF.

The period control circuit 251 of the refresh address control circuit 250 may generate the period selection signal P_SEL that is enabled by the mode entry signal PCG_FL and disabled by a falling edge of the final target refresh command TREF. The first latch 253 may latch, as the first target address TADD1, the active address ADD_ACT according to the mode entry signal PCG_FL. The selection circuit 255 may output the first target address TADD1 as the final target address TADD when the period selection signal P_SEL is enabled to a logic high level (at S970). The address output circuit 256 may calculate the row-hammer address RH_ADD from the final target address TADD, and output the row-hammer address RH_ADD according to the final target address TADD.

The row control circuit 212 may perform a target refresh operation of refreshing one or more neighboring word lines corresponding to the row-hammer address RH_DD according to the final target refresh command TREF (at S980). Accordingly, after the precharge operation according to the precharge command PCG is performed for the precharge to active time tRP defined in the specification, the target refresh operation according to the first target refresh command TREF1 may be performed during a refresh period tRFM.

Referring to FIG. 11, a target refresh operation according to the second target refresh command TREF2 is shown.

The memory controller 100 may provide the command/address signal C/A including the normal refresh command REF, and the docks CK_t and CK_c, to the semiconductor memory device 200 (at S1010).

In a case where the number of inputs of the normal refresh command REF does not reach the preset number of times ("NO" of S1020), the refresh counter of the semiconductor memory device 200 may generate the counting address that is sequentially increasing according to the normal refresh command REF (at S1030). The row control circuit 212 may perform a normal refresh operation of sequentially refreshing the plurality of word lines WL corresponding to the counting address according to the normal refresh command REF (at S1040).

On the contrary, in a case where the number of inputs of the normal refresh command REF reaches the preset number of times ("YES" of S1020), the second command generation circuit 234 of the refresh command control circuit 230 may generate the second target refresh command TREF2 (at S1050). The command output circuit 236 may output the second target refresh command TREF2 as the final target refresh command TREF.

The second latch 254 may output the second target address TADD2 by latching the active address ADD_ACT at a random time according to the sampling signal SAM_EN. The selection circuit 255 may output the second target address TADD2 as the final target address TADD when the period selection signal P_SEL is disabled to a logic low level (at S1060). The address output circuit 256 may calculate the row-hammer address RH_ADD from the final target address TADD, and output the row-hammer address RH_ADD according to the final target address TADD.

The row control circuit 212 may perform a target refresh operation of refreshing one or more neighboring word lines corresponding to the row-hammer address RH_ADD according to the final target refresh command TREF (at S1070).

As described above, the semiconductor memory device 200 may perform the target refresh operation of refreshing one or more neighboring word lines corresponding to the row-hammer address RH_ADD, according to the first target refresh command TREF1 that is internally generated by using the precharge command PCG, or the second target refresh command TREF2 that is internally generated whenever the number of inputs of the normal refresh command REF reaches the preset number of times. That is, the semiconductor memory device 200 may perform the target refresh according to the first target refresh command TREF1 or the second target refresh command TREF2, which are internally generated, without receiving a separate target refresh command from the memory controller 100, thereby preventing a performance drop that may occur due to issuance of the target refresh command.

In various embodiments of the present invention, although it is described as an example that the refresh control module 130 of the memory controller 100 is composed of the LFSR based random pattern generator while the random signal generation circuit 252 of the semiconductor memory device is composed of the PRBS based random pattern generator, the present invention is not limited thereto. According to an embodiment, the refresh control module 130 may be implemented with any selected from the LFSR based or PRBS based random pattern generator, and the random signal generation circuit 252 may be implemented with the other random pattern generator.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. A memory system, comprising:
a memory device for storing data;
a memory controller outside the memory device and suitable for generating a first target address, wherein the memory controller samples an address according to an active command, and provides the active command, a precharge command, a normal refresh command, the address and the first target address, to the memory device; and
the memory device suitable for generating a first target refresh command, wherein the first target refresh command is generated according to the precharge command provided from the memory controller outside the memory device and the address provided from the memory controller outside the memory device, and one or more word lines corresponding to the first target address is refreshed according to the first target refresh command.

2. The memory system of claim 1, wherein the memory controller provides, together with the active command, one of the address and the first target address.

3. The memory system of claim 2,
wherein the memory controller is further suitable for setting a specific bit of the address, and
wherein the memory controller provides the address together with the precharge command after a predetermined time from a time point when the first target address is provided together with the active command.

4. The memory system of claim 3, wherein the predetermined time corresponds to a minimum row address strobe time (tRAS) to be secured to complete a read or write operation after an active operation.

5. The memory system of claim 1,
wherein the memory device generates a second target address by sampling the address according to the active command, generates a second target refresh command according to the normal refresh command, and refreshing one or more word lines corresponding to the second target address according to the second target refresh command.

6. The memory system of claim 5,
wherein the memory device generates the first target refresh command by delaying a specific bit of the address by a scheduled time when the precharge command is inputted, and
wherein the memory device generates the second target refresh command whenever a number of inputs of the normal refresh command reaches a preset number.

7. The memory system of claim 6, wherein the scheduled time corresponds to a precharge to active time (tRP) which is a time amount from a precharge operation to an active operation.

8. The memory system of claim 1, wherein the memory controller includes:

a processor suitable for issuing a set number of the normal refresh command during a predetermined period;
a refresh control module suitable for generating the first target address by sampling the address according to the active command; and
a scheduler suitable for providing to the memory device, the active command together with the address or the first target address, providing the precharge command together with the address, and providing the normal refresh command.

9. The memory system of claim 1, wherein the memory device includes:
a refresh command control circuit suitable for:
generating the first target refresh command according to a specific bit of the address and the precharge command,
generating a second target refresh command according to the normal refresh command, and
generating a final target refresh command according to the first target refresh command or the second target refresh command;
a refresh address control circuit suitable for:
generating a second target address by sampling the address according to the active command, and
providing a row-hammer address to the memory device, by selecting one of the first target address and the second target address; and
a row control circuit suitable for refreshing one or more word lines corresponding to the row-hammer address according to the final target refresh command.

10. A semiconductor memory device, comprising:
a refresh command control circuit suitable for:
generating a first target refresh command according to a mode entry signal that is generated by an address and a precharge command,
generating a second target refresh command according to a normal refresh command, and
generating a final target refresh command according to the first target refresh command or the second target refresh command;
an active latch suitable for latching the address as an active address according to an active command;
a refresh address control circuit suitable for:
generating a first target address by latching the active address according to the mode entry signal,
generating a second target address by randomly sampling the active address, and
providing a row-hammer address by selecting one of the first target address and the second target address; and
a row control circuit suitable for refreshing one or more word lines corresponding to the row-hammer address according to the final target refresh command.

11. The semiconductor memory device of claim 10, wherein the refresh command control circuit includes:
a first command generation circuit suitable for:
generating the mode entry signal according to a specific bit of the address and the precharge command, and
outputting the first target refresh command by delaying the mode entry signal by a scheduled time;
a second command generation circuit suitable for generating the second target refresh command whenever a number of inputs of the normal refresh command reaches a preset number; and
a command output circuit suitable for generating the final target refresh command when one of the first target refresh command and the second target refresh command is generated.

12. The semiconductor memory device of claim 11, wherein the first command generation circuit includes:
a mode entry circuit suitable for generating the mode entry signal according to the specific bit of the address when the precharge command is inputted; and
a timing control circuit suitable for outputting the first target refresh command by delaying the mode entry signal by a precharge to active time (tRP) which is a time amount from a precharge operation to an active operation.

13. The semiconductor memory device of claim 12, wherein the mode entry circuit includes:
a mode latch suitable for generating a mode enable signal by latching the specific bit of the address according to the precharge command; and
a pulse generator suitable for generating the mode entry signal by delaying the precharge command according to the mode enable signal.

14. The semiconductor memory device of claim 12, wherein the timing control circuit includes a plurality of flip flops coupled in series, and
wherein a number of the flip-flops is set depending on the precharge to active time (tRP).

15. The semiconductor memory device of claim 10, wherein the refresh address control circuit includes:
a period control circuit suitable for generating a period selection signal that is defined by the mode entry signal and the final target refresh command;
a first latch suitable for outputting the first target address by latching the active address according to the mode entry signal;
a second latch suitable for outputting the second target address by latching the active address according to a sampling signal;
a selection circuit suitable for outputting the final target address by selecting one of the first target address and the second target address according to the period selection signal; and
an address output circuit suitable for calculating the row-hammer address from the final target address and outputting the row-hammer address according to the final target address.

16. The semiconductor memory device of claim 15, wherein the period control circuit includes:
an end signal generation circuit suitable for generating a mode end signal that is enabled according to a falling edge of the final target refresh command; and
a period definition circuit suitable for generating the period selection signal according to the mode entry signal and the mode end signal.

17. A semiconductor memory device, comprising:
a refresh command control circuit suitable for generating a target refresh command according to a mode entry signal that is generated by an address and a precharge command;
an active latch suitable for latching the address as an active address according to an active command;
a refresh address control circuit suitable for generating a target address by latching the active address according to the mode entry signal; and
a row control circuit suitable for refreshing one or more word lines corresponding to the target address according to the target refresh command.

18. An operating method of a memory device, comprising:
latching an address as an active address according to an active command;

generating a mode entry signal according to a specific bit of the address and a precharge command;

generating a first target refresh command by delaying the mode entry signal by a scheduled time;

generating a first target address by latching the active address according to the mode entry signal; and refreshing one or more word lines corresponding to the first target address according to the first target refresh command.

19. The operating method of claim 18, wherein the generating a mode entry signal includes:

generating a mode enable signal by latching the specific bit of the address according to the precharge command; and generating the mode entry signal by delaying the precharge command according to the mode enable signal.

20. The operating method of claim 18, wherein the scheduled time corresponds to a precharge to active time (tRP) which is a time amount from a precharge operation to an active operation.

21. The operating method of claim 18, further comprising:

generating a second target refresh command according to a normal refresh command;

generating a second target address by sampling the active address according to a sampling signal; and refreshing one or more word lines corresponding to the second target address according to the second target refresh command.

22. The operating method of claim 21, wherein the generating the second target refresh command includes generating the second target refresh command whenever a number of inputs of the normal refresh command reaches a preset number.

23. An operating method of a memory system, the operating method comprising:

providing, by a controller outside a memory device for storing data, a set of an indicator and a precharge command; and performing, by the memory device, a target refresh operation according to an active address in response to at least one of the set provided by the controller outside the memory device and a predetermined number of inputs of a refresh command.

24. The operating method of claim 23, further comprising generating, by the controller, before the providing, the active address indicating a memory-cell-row that is activated a predetermined number of times or greater.

* * * * *